(12) United States Patent
Stumpf

(10) Patent No.: US 8,174,104 B2
(45) Date of Patent: May 8, 2012

(54) SEMICONDUCTOR ARRANGEMENT HAVING SPECIALLY FASHIONED BOND WIRES

(75) Inventor: Pascal Stumpf, Horbourg-Wihr (FR)

(73) Assignee: Micronas GmbH, Freiburg (DE)

( * ) Notice: Subject to any disclaimer, the term of this patent is extended or adjusted under 35 U.S.C. 154(b) by 150 days.

(21) Appl. No.: 12/481,255

(22) Filed: Jun. 9, 2009

(65) Prior Publication Data
US 2009/0302447 A1 Dec. 10, 2009

(30) Foreign Application Priority Data
Jun. 9, 2008 (EP) .................................. 08010430

(51) Int. Cl.
*H01L 23/52* (2006.01)
*H01L 21/50* (2006.01)

(52) U.S. Cl. ......... 257/685; 257/E23.141; 257/E21.499; 257/E25.013; 257/E23.023; 257/723; 257/777; 257/784; 257/786; 257/690; 257/676; 257/773; 257/742; 257/691; 257/696; 257/698

(58) Field of Classification Search ............ 257/685.69, 257/E23.141, 686, 723, 777, 786, 784, 676, 257/691, 690, 696, 698, 692, 738, 737, 734, 257/E23.023, 741, 773, E21.499, E25.013, 257/E21.518, E21.509; 174/258; 228/3, 228/1, 44, 3.1, 1.1, 44.7, 15; 438/617
See application file for complete search history.

(56) References Cited

U.S. PATENT DOCUMENTS

| | | | | |
|---|---|---|---|---|
| 3,718,272 A * | 2/1973 | Eltzroth et al. ................ 228/3.1 | | |
| 4,096,983 A | 6/1978 | Beilein et al. | | |
| 4,845,543 A * | 7/1989 | Okikawa et al. ............... 257/738 | | |
| 4,993,618 A | 2/1991 | Toyozawa et al. | | |
| 6,476,506 B1 | 11/2002 | O'Connor et al. | | |
| 6,787,926 B2 * | 9/2004 | Chen et al. ..................... 257/784 | | |
| 6,835,898 B2 * | 12/2004 | Eldridge et al. ............... 174/267 | | |
| 7,276,437 B2 * | 10/2007 | Yano et al. ..................... 438/617 | | |
| 7,285,854 B2 * | 10/2007 | Ishikawa et al. ............... 257/738 | | |

(Continued)

FOREIGN PATENT DOCUMENTS

EP 1 367 644 A1 12/2003

(Continued)

OTHER PUBLICATIONS

"Vickers Hardness Test", Nov. 13, 2008, www.gordonengland.co.uk/harndess/vickers.htm.

*Primary Examiner* — A O Williams
(74) *Attorney, Agent, or Firm* — Muncy, Geissler, Olds & Lowe, PLLC

(57) ABSTRACT

A semiconductor arrangement includes first and second integrated circuits (dies), an electrically conductive intermediate element, and one or more bond conductors. The first and the second integrated circuits are arranged in a package. The first integrated circuit has a first contact pad. The second integrated circuit has a second contact pad. The intermediate element is disposed on the second contact pad. The conductors electrically connect the first and the second integrated circuits. At least one of the bond conductors has a first end electrically connected to the first contact pad, and a second wedge shaped end electrically connected to the intermediate element. The bond conductor is made of a first material and the intermediate element is made of a second material which is softer than the first material.

12 Claims, 1 Drawing Sheet

U.S. PATENT DOCUMENTS

| | | | |
|---|---|---|---|
| 7,768,135 B1 * | 8/2010 | St. Amand et al. | 257/777 |
| 7,906,855 B1 * | 3/2011 | Kim et al. | 257/777 |
| 2003/0042621 A1 | 3/2003 | Chen et al. | |
| 2003/0113574 A1 | 6/2003 | Liao | |
| 2003/0151135 A1 * | 8/2003 | Sakamoto et al. | 257/723 |
| 2004/0072396 A1 | 4/2004 | Tiziani et al. | |
| 2006/0012024 A1 * | 1/2006 | Lin et al. | 257/692 |
| 2006/0216863 A1 | 9/2006 | Arakawa | |
| 2006/0223238 A1 * | 10/2006 | Koh et al. | 438/123 |
| 2007/0102798 A1 * | 5/2007 | Nishizawa et al. | 257/679 |
| 2007/0222087 A1 * | 9/2007 | Lee et al. | 257/784 |
| 2008/0076251 A1 | 3/2008 | Bischoff et al. | |
| 2008/0258291 A1 * | 10/2008 | Liu et al. | 257/690 |
| 2009/0014848 A1 * | 1/2009 | Ong Wai Lian et al. | 257/666 |
| 2009/0321501 A1 * | 12/2009 | Liang et al. | 228/180.5 |
| 2010/0003904 A1 * | 1/2010 | Duescher | 451/259 |
| 2010/0133688 A1 * | 6/2010 | Shigihara et al. | 257/738 |
| 2010/0148349 A1 * | 6/2010 | Kim et al. | 257/690 |
| 2011/0089566 A1 * | 4/2011 | Pendse et al. | 257/762 |
| 2011/0104510 A1 * | 5/2011 | Uno et al. | 428/576 |

FOREIGN PATENT DOCUMENTS

| | | |
|---|---|---|
| EP | 1 818 984 A2 | 8/2007 |
| GB | 2157607 | 10/1985 |
| JP | 61259555 | 11/1986 |
| JP | 10-229100 A * | 8/1998 |
| JP | 2005-294874 A * | 10/2005 |
| JP | 2007134504 | 5/2007 |

* cited by examiner

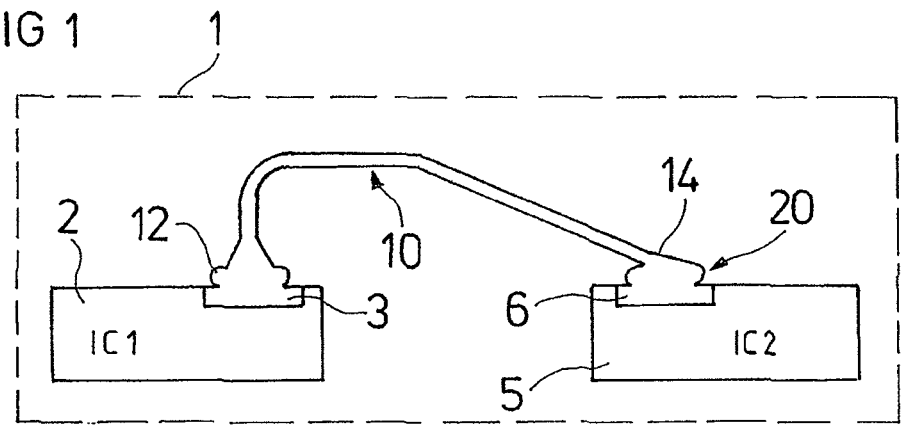
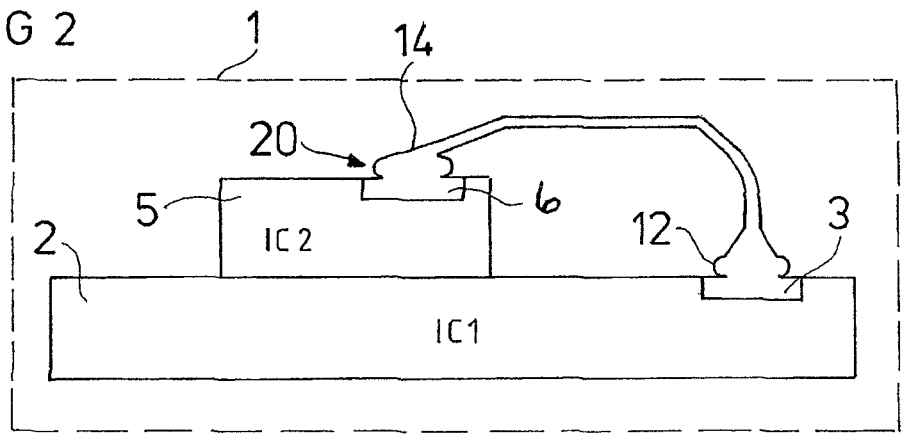
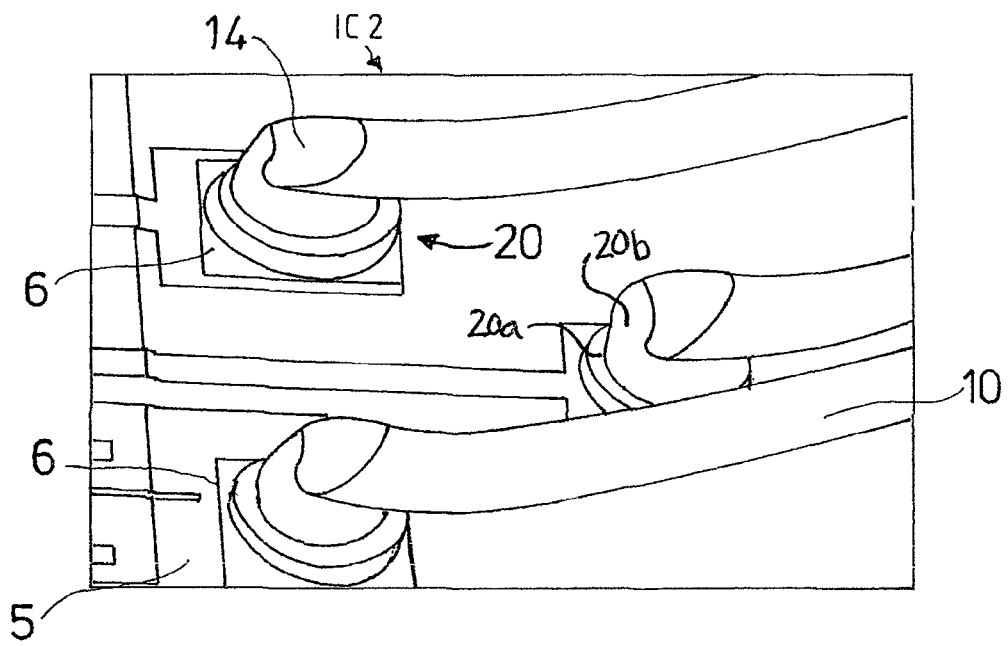

SEMICONDUCTOR ARRANGEMENT HAVING SPECIALLY FASHIONED BOND WIRES

PRIORITY INFORMATION

This patent application claims priority from European patent application 08 010 430.0 filed Jun. 9, 2008, which is hereby incorporated by reference.

BACKGROUND OF THE INVENTION

The present invention relates to the field of semiconductors, and in particular to a semiconductor arrangement having at least two integrated circuits (dies) arranged in a housing or a package and electrically connected to each other via bond conductors.

Bond conductors or bond wires have long been known in the fabrication of integrated circuits. In microelectronic construction and connection technology, bond conductors are commonly made of gold or a gold alloy. Alternatively, some bond conductors are made of aluminum.

Typically, bond conductors are used in an integrated circuit to connect contacts that extend outside a housing (also referred to as "pins") to electrical contact regions (also referred to as "bond islands" or "pads") disposed on a chip lying inside the housing. The bond conductor provides an electrical connection between the integrated circuit proper and the wiring substrate of an electronic circuit. The bond conductor extends between and electrically connects/couples the contact pads of the chip and the inner part of the external contact. The bond conductors may be coupled to the pad and the contact using either thermosonic bonding or ultrasonic bonding. After bonding, the integrated circuits are hermetically potted into a housing, preferably a plastic housing.

Bond conductors are also used for electrically connecting respective contact pads disposed on two or more dies in a housing. According to G. G. Harman, *Wire Bonding in Microelectronics*, McGraw-Hill, 1997, pages 1-10, pages 67 ff. and pages 203 ff., in the ball-wedge technique, the bond wire is bonded to the contact pad of a first integrated circuit using flamed-off sphere (also known as a "free-air ball" (FAB)), and at the other end is flattened into a wedge shape and connected to the contact pad of the second integrated circuit. However, disadvantageously, the ball-wedge technique exerts compressive loading (e.g., using ultrasonic techniques) on the second integrated circuit when the bond wire is flattened and pressed thereon. In order to reduce the compressive loading on the second integrated circuit, spherical intermediate elements made of electrically conductive material are provided to sit on the contact pad of the second integrated circuit. The second end of the bond conductor, flattened into a wedge shape, is pressed onto this spherical intermediate element. This intermediate element serves to relieve the pressure on the second integrated circuit as the bond wire is pressed thereon.

Prior art bond conductors may be made from materials such as copper and silver. However, these materials may tarnish (i.e., oxidize upon contact with air), for example, during the manufacturing process, thereby reducing the bonding capacity of the bond conductors. Therefore, bonding of, for example, copper bond conductors is often carried out using a shielding gas in order to prevent the oxidation of the copper. As a result, chip-to-chip bond conductors are generally made of gold, despite its inferior electrical and mechanical properties to that of copper and silver, since, unlike copper and silver, gold does not tarnish. However, disadvantageously, gold bond conductor increase manufacturing costs due to the high price of the material (i.e., gold). This becomes especially problematic where a large number (e.g., hundreds to thousands) of bond conductors are necessary in a semiconductor arrangement due to the increasingly high packing density inside housings.

Due to the high costs related to gold bond conductors, alternative techniques have been used to utilize other more favorable materials. In a first example, according to published U.S. Patent Application 2003/0113574 A1, gold-jacketed silver or palladium wires, as compared with pure gold wires, have been furnished to reduce costs. In a second example, German patent application DE 10 2005 011028 A1 discloses the use of copper-gold alloys in bond conductors. In comparison with pure gold, copper-gold alloys have a significantly greater hardness. However, this hardness is undesirable for bond wires because integrated circuits may be damaged by the pressing of the bond wire or bond conductor onto the contact pad of the integrated circuit. For example, gold-copper alloys on copper wires can cause cracking in the silicon chip of the integrated circuit when pressed against the contact pad, which may lead to the failure of the integrated circuit. In a third example, German patent application DE 10 2005 011028 A1 discloses a copper bond conductor containing a small quantity of gold in the surface thereof. This publication discloses that it is especially preferable to use a copper bond conductor having gold enriched surface. The quantity of gold used to enrich the surface corresponds to a jacketing of at most fifty nano-meters (50 nm) thick, if the gold were fashioned uniformly as a coating on the wire. However, similar to pure gold bond conductors, such gold-coated copper wires are relatively expensive to manufacture.

Therefore, there is a need in the art for a semiconductor arrangement having a bond conductor that reduces associated manufacturing costs.

SUMMARY OF THE INVENTION

According to an aspect of the invention, a semiconductor arrangement includes at least two integrated circuits arranged in a housing and are electrically connected to each other via bond conductors. At least one of the bond conductors has a first end electrically connected to a first contact pad of the first integrated circuit, and a second end, tapering in a wedge shape, electrically connected to an electrically conductive intermediate element disposed on a contact pad of the second integrated circuit. The bond conductor is made of a different material from the intermediate element, where the material of the intermediate element is softer than the material of the bond conductor.

According to another aspect of the invention, a method for fabricating a semiconductor arrangement includes providing a first integrated circuit having at least one first contact pad, a second integrated circuit having at least one second contact pad, a bond conductor for electrically connecting the first contact pad and the second contact pad; applying an electrically conductive intermediate element on the second contact pad of the second integrated circuit such that the electrically conductive intermediate element is in electrically conductive connection with the contact pad of the second integrated circuit; attaching a first end of the bond conductor to the first contact pad of the first integrated circuit; and attaching a second, wedge-shaped end of the bond conductor to the intermediate element, where the material of the intermediate element is softer than the material of the bond conductor.

According to yet another aspect of the invention, a semiconductor arrangement includes first and second dies, an electrically conductive intermediate element and one or more bond conductors. The first and the second dies are arranged in a package. The first die has a first contact pad. The second die has a second contact pad. The electrically conductive intermediate element is disposed on the second contact pad. The one or more bond conductors electrically connected the first and the second dies, where at least one of the bond conductors has a first end electrically connected to the first contact pad, and a second wedge shaped end electrically connected to the intermediate element. The bond conductor is made of a first material and the intermediate element is made of a second material which is softer than the first material.

Manufacturing costs and complexity may be reduced using bond conductors of the present invention. For example, a wedge-shaped end of a bond conductor, which is made from, for example, copper or a copper alloy, is indirectly connected to an integrated-circuit contact pad made from, for example, aluminum or an aluminum alloy. This is accomplished by applying and contacting the wedge-shaped end of the bond conductor to an intermediate element that sits on the contact pad of the integrated circuit. This intermediate element is preferably fashioned in a spherical or an approximately spherical shape and is made of a material softer than the bond conductor (e.g., gold, a gold alloy or doped gold).

When the wedge-shaped end of the bond conductor is pressed onto the intermediate element, the associated pressure is indirectly transferred onto the semiconductor of the integrated circuit by being intercepted and dispersed by the intermediate element. As a result, the mechanical loading of the integrated circuit may be significantly reduced in comparison with conventional prior art methods where, in contrast, the wedge-shaped end of the bond conductor is pressed directly onto the contact pad of the integrated circuit.

It falls within the scope of the invention that the bond conductor contacts the contact pads of two integrated circuits (dies) that are installed in a common housing or package. The two integrated circuits may be arranged one beside the other or one above the other. In some embodiments, the bond conductor has a diameter of approximately 20-30 µm (nanometers) and/or a Vickers hardness less than or equal to seventy (<70).

These and other objects, features and advantages of the present invention will become more apparent in light of the following detailed description of preferred embodiments thereof, as illustrated in the accompanying drawings.

BRIEF DESCRIPTION OF THE DRAWINGS

In the Drawings, unless stated to the contrary, identical reference characters identify similar parts with similar meaning. The drawings are as follows:

FIG. 1 is a simplified illustration of one embodiment of an IC housing including a bond conductor connecting two adjacent integrated circuits;

FIG. 2 is a simplified illustration of another embodiment of an IC housing including a bond conductor connecting two stacked integrated circuits; and FIG. 3 illustrates one end of the bond conductor of FIG. 1 or 2.

DETAILED DESCRIPTION OF THE INVENTION

FIG. 1 is a simplified illustration of one embodiment of a package or a housing 1. The housing 1 includes a first integrated circuit IC1 disposed adjacent to a second integrated circuit IC2. The first integrated circuit IC1 has a first semiconductor body 2 having one or more contact pads 3 disposed therein or thereon. The first semiconductor body 2 is made of, for example, silicon. The contact pads 3 are made of, for example, aluminum or an aluminum alloy. The second integrated circuit IC2 has a second semiconductor body 5 having one or more contact pads 6 disposed therein or thereon. The contact pads 3 and 6 of the first and the second integrated circuits IC1, IC2 are electrically connected/coupled via one or more bond conductors 10. Each bond conductor 10 is made of a material that is significantly more favorable than gold in terms of cost such as, but not limited to, copper or a copper alloy.

The bond conductor 10 is attached to the first integrated circuit IC1 using the ball-wedge method (also known as "ball-wedge bonding"). Alternatively, other attaching/contacting methods may also be used. When using the ball-wedge bonding method, a suitable tool is used to guide the bond conductor 10 inside a capillary made of sintered metal or ceramic. The end of the bond conductor 10 protruding from the bottom of the capillary is melted by a flame or an electrical discharge such that a sphere forms as a result of surface tension. This sphere is bonded to the contact pad 3 of the first integrated circuit IC1 by applying pressure, heat and ultrasound. The sphere is spread out to some degree by the capillary, such that a "nail head" configuration 12 is formed.

The bond conductor 10 is led/extended to the second contact point, the contact pad 6 of the second integrated circuit IC2. In contrast to conventional techniques, however, the bond conductor 10 is not pressed directly onto the contact pad 6. Instead, an intermediate element 20 having, for example, a substantially spherical or globular shape is placed on the contact pad 6. This intermediate element 20 is made of a softer material than the bond conductor 10. For example, where the bond conductor 10 is made of copper, the intermediate element 20 is made of a material such as, but not limited to, gold, a gold alloy or doped gold.

The bond conductor 10 is disposed on and tightly bonded to the intermediate element 20 by ultrasound, heat and pressure. A wire clamp mounted above the capillary of the bonding tool prevents the bond conductor 10 from being pulled along when the tool is lifted. Instead, the bond conductor 10 is broken in the region of the intermediate element 20. As a result, a wedge-shaped end 14 of the bond conductor 10 is produced, which is electrically connected to the intermediate element 20.

The spherical intermediate element 20 may be placed on the contact pad 6 of the second integrated circuit IC2 with, for example, a second tool. The second tool may be a capillary made of sintered metal or ceramic. As in the shaping of the spherical end 12 of the bond conductor 10, a gold wire, for example, is led through the capillary of this second tool. The gold wire end protruding from the bottom of the capillary of the second tool may be melted with a flame or an electrical discharge, such that a sphere or ball is formed as a result of surface tension. This sphere or ball formed from the gold wire is placed on the contact pad 6 of the second integrated circuit IC2 by pressure, heat and ultrasound. The gold wire is then broken by the tool such that the spherical intermediate element 20 having a pin-shaped extension remains on the contact pad 6.

FIG. 2 is a simplified illustration of another embodiment of a package or a housing 1. The housing 1 includes a first integrated circuit IC1 and a second integrated circuit IC2 arranged in a stacked configuration. For example, as illustrated, the second integrated circuit IC2 is disposed, for example, directly on the first integrated circuit IC1. The contact pad 6 of the second integrated circuit IC2 is connected to the contact pad 3 of the first integrated circuit IC1 via the bond conductor 10 made of, for example, copper. The spherical end 12 of the bond conductor 10 is disposed on the contact pad 3 of the first integrated circuit IC1, while the wedge-shaped end 14 of the bond conductor 10 is disposed on the contact pad 6 of the second integrated circuit IC2 via the intermediate element 20.

Although FIGS. 1 and 2 illustrate a single bond conductor 10 for electrically connecting the first integrated circuit IC1 and the second integrated circuit IC2 for ease of illustration, one of ordinary skill will understand that a plurality of these bond conductors may be provided for electrically connecting integrated circuits inside the housing 1. For example, there may be hundreds of such bond conductors 10 between two or more electrically connected integrated circuits.

FIG. 3 illustrates three bond conductors 10 in the region of their wedge-shaped ends 14. Each bond conductor 10 is electrically connected to, via the intermediate elements 20, the rectangular contact pads 6 of an integrated circuit IC2. The intermediate element 20 disposed on the contact pads 6 is made of gold, however, is not limited thereto. As illustrated, after connecting each bond conductor 10 to a respective contact pad 6, the intermediate elements 20 may no longer have a spherical shape. Rather, the intermediate element 20 may be formed as a dish-shaped portion 20a having a pin-shaped extension 20b located thereabove. Although is appears from FIG. 3 that the dish-shaped portion 20a and the pin-shaped extension 20b are two distinct elements, they are preferably integrally connected. The dish-shaped portion 20a having the pin-shaped extension 20b is formed where the capillary of the tool somewhat compresses the, for example, spherically shaped intermediate element 20 and a small part remains on this intermediate element 20 when the gold wire is broken. This small part, which remains standing out from the dish-shaped portion 20a, is the pin-shaped extension 20b in FIG. 3.

Although the present invention has been illustrated and described with respect to several preferred embodiments thereof, various changes, omissions and additions to the form and detail thereof, may be made therein, without departing from the spirit and scope of the invention.

What is claimed is:

1. A semiconductor arrangement, comprising: at least two integrated circuits arranged in a housing and electrically connected to each other via bond conductors, at least one of the bond conductors having a first end electrically connected to a first contact pad of the first integrated circuit, and a second end tapering to a wedge shape that is electrically connected to an electrically conductive intermediate element disposed on a contact pad of the second integrated circuit, where the bond conductor is made of a different material from the intermediate element, and where the material of the intermediate element is softer than the material of the bond conductor.

2. The semiconductor arrangement of claim 1, where the material of the bond conductor comprises copper or a copper alloy.

3. The semiconductor arrangement of claim 1, where the intermediate element comprises gold, a gold alloy or doped gold.

4. The semiconductor arrangement of claim 1, where the intermediate element has a spherical or an approximately spherical shape.

5. The semiconductor arrangement of claim 1, where the first end of the bond conductor has a spherical or an approximately spherical shape.

6. The semiconductor arrangement of claim 1, where the bond conductor has a diameter of approximately 20-30 µm.

7. The semiconductor arrangement of claim 1, where the material of the bond conductor has a Vickers hardness less than or equal to about 70.

8. The semiconductor arrangement of claim 1, where the first integrated circuit is arranged adjacent to the second integrated circuit.

9. The semiconductor arrangement of claim 1, where the second integrated circuit is disposed on the first integrated circuit.

10. The semiconductor arrangement of claim 1, where the contact pads comprise aluminum or an aluminum alloy.

11. A semiconductor arrangement, comprising:
first and second dies arranged in a package, the first die having a first contact pad, and the second die having a second contact pad;
an electrically conductive intermediate element disposed on the second contact pad; and
one or more bond conductors electrically connecting the first and the second dies, at least one of the bond conductors having a first end electrically connected to the first contact pad, and a second wedge shaped end electrically connected to the intermediate element;
wherein the bond conductor is made of a first material which is one of copper or a copper alloy or another material having a Vickers hardness less than or equal to 70 and the intermediate element is made of a second material which is one of gold or another material softer than the first material.

12. The semiconductor arrangement of claim 1, wherein the first end tapers to a wedge shape.

* * * * *